United States Patent
An et al.

(10) Patent No.: US 7,569,973 B2
(45) Date of Patent: Aug. 4, 2009

(54) METHOD FOR DRIVING PIEZOELECTRIC ELEMENT OR OPTICAL MODULATOR INCLUDING PIEZOELECTRIC ELEMENT

(75) Inventors: Seung-Do An, Suwon-si (KR); Jong-Hyeong Song, Suwon-si (KR); Anatoliy Lapchuk, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/128,567

(22) Filed: May 28, 2008

(65) Prior Publication Data

US 2008/0297903 A1  Dec. 4, 2008

(30) Foreign Application Priority Data

Jun. 1, 2007  (KR) .................. 10-2007-0053750

(51) Int. Cl.
*H01L 41/09* (2006.01)
*G02F 1/00* (2006.01)
(52) U.S. Cl. ..................................... 310/317
(58) Field of Classification Search .......... 310/317; 359/323
See application file for complete search history.

(56) References Cited

U.S. PATENT DOCUMENTS 6,456,417 B1 * 9/2002 Maywar et al. ........... 359/245
7,133,184 B2 * 11/2006 Shin et al. ................. 359/291
7,385,750 B2 * 6/2008 Govil et al. ............... 359/291
2003/0067667 A1 * 4/2003 Wang et al. ............... 359/323

FOREIGN PATENT DOCUMENTS

KR  10-2002-0032549 A  5/2002
KR  10-2006-0132940 A  12/2006

* cited by examiner

*Primary Examiner*—Thomas M Dougherty
(74) *Attorney, Agent, or Firm*—Christensen O'Connor Johnson Kindness PLLC

(57) ABSTRACT

Disclosed are a method for driving a piezoelectric element or an optical modulator including a piezoelectric element and a recorded medium recorded with a program for executing the same. In accordance with an embodiment of the present invention, the method for driving a piezoelectric element causing a displacement object to be displaced by being contracted or expanded according to a supplied driving voltage, including supplying a driving signal to the piezoelectric element during a first driving period in a first voltage range; supplying a control signal for controlling a polarization hysteresis of the piezoelectric element according to a driving, performed during the first driving period, to the piezoelectric element; and supplying the driving signal to the piezoelectric element during a second driving period in a second voltage range.

5 Claims, 16 Drawing Sheets

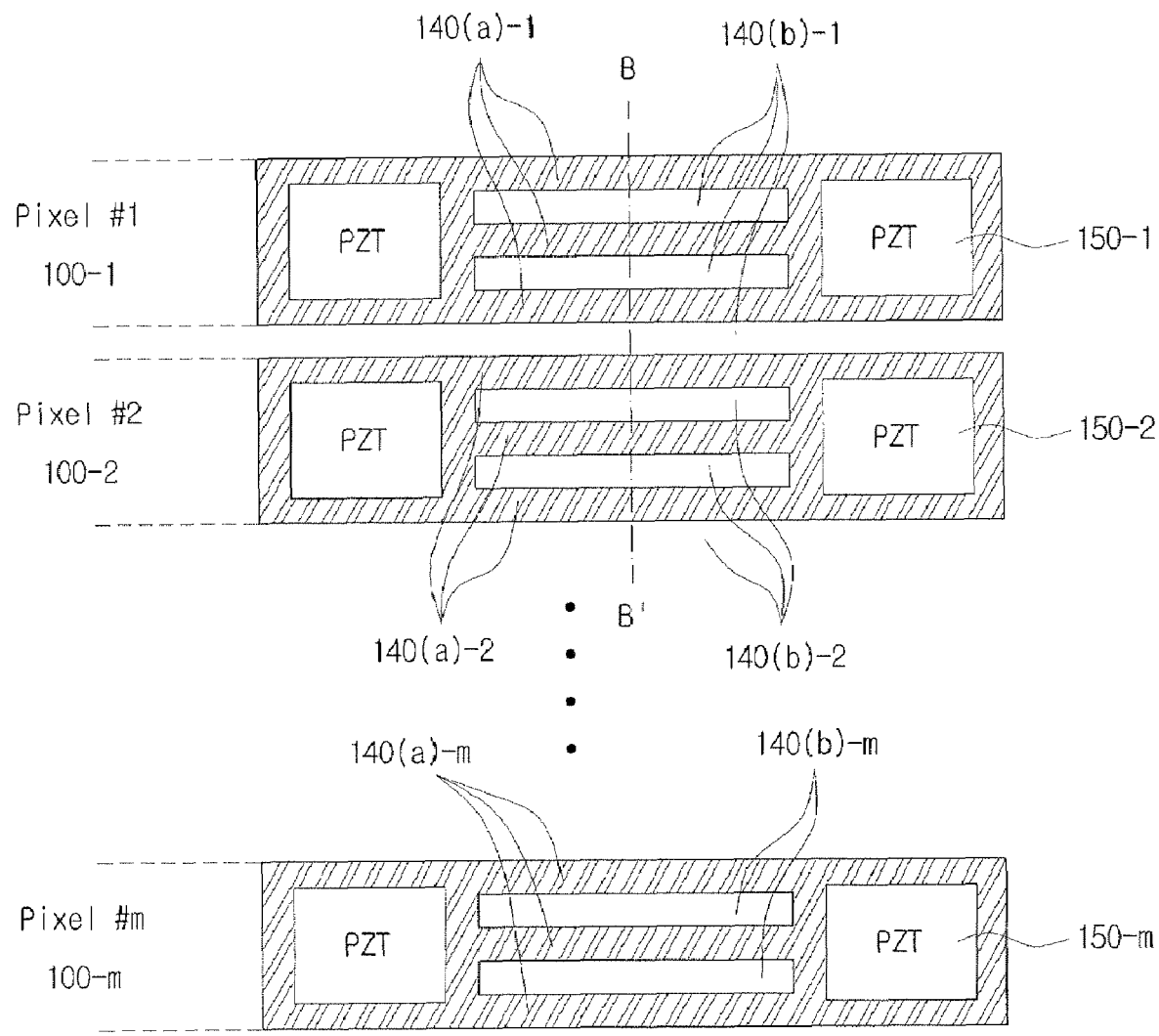

US 7,569,973 B2

METHOD FOR DRIVING PIEZOELECTRIC ELEMENT OR OPTICAL MODULATOR INCLUDING PIEZOELECTRIC ELEMENT

CROSS-REFERENCE TO RELATED PATENT APPLICATIONS

This application claims the benefit of Korean Patent Application No. 10-2007-0053750, filed on Jun. 1, 2007, in the Korean Intellectual Property Office, the disclosure of which is incorporated herein in its entirety by reference.

BACKGROUND OF THE INVENTION

Field of the Invention

The present invention relates to a piezoelectric element, more specifically to a method for driving a piezoelectric element, a method for an optical modulator including a piezoelectric element and a recorded medium recorded with a program for executing the same that can reduce the hysteresis of the piezoelectric element.

A piezoelectric element refers to a micromachine which provides a driving force for causing the displacement of an object desired to be displaced (hereinafter, referred to as a displacement object) by using a piezoelectric material contracted or expanded according to a supplied driving voltage. The piezoelectric element is extensively used for various micro electro mechanical system (MEMS) devices such as scanning microscopes, optical probes, optical modulators and data storing devices.

The relationship between the supplied driving voltage and the corresponding displacement has the hysteresis as shown in FIG. 1. As such, the hysteresis of the piezoelectric is caused by the polarization hysteresis related to the piezoelectric effect of a piezoelectric element according to the supplied driving voltage (i.e. the contraction or expansion according to the polarization of a piezoelectric layer). Below is described with reference to FIG. 1.

Referring to the hysteresis curves of a piezoelectric element of FIG. 1, in the case of supplying gradually increased driving voltage to the piezoelectric element, the position of the replacement object is changed according to a first hysteresis curve 11. In the case of supplying gradually decreased driving voltage to the piezoelectric element, the position of the replacement object is changed according to a second hysteresis curve 12. In other words, the relationship between the voltage and the displacement caused by the hysteresis of the piezoelectric element (i.e. the polarization hysteresis) has different characteristics for an increasing direction and a decreasing direction.

Accordingly, even though a driving voltage having the same magnitude is supplied to the piezoelectric element, the displacement of the displacement object has different values according to whether the increased driving voltage or the decreased driving voltage is supplied.

For example, even through the driving voltage $V_2$ having the same magnitude is supplied to the piezoelectric element, if the driving voltage is increased from $V_1$ to $V_2$, the displacement of the displacement object corresponds to $S_{21}$. Also, if the driving voltage is decreased from $V_{max}$ to $V_2$, the displacement corresponds to $S_{22}$. As a result, it is recognized that the displacement of the displacement object may have different values in two cases.

Briefly, in accordance with the conventional piezoelectric driving method, even though the driving voltage having the same magnitude is supplied, the displacement of the displacement object may have different values due to the hysteresis of the piezoelectric element. This makes it impossible to give accuracy and reliability to various application devices using the piezoelectric element.

SUMMARY OF THE INVENTION

Accordingly, the present invention provides a method for driving a piezoelectric element, a method for an optical modulator including a piezoelectric element and a recorded medium recorded with a program for executing the same that can give improved accuracy and reliability to driving a piezoelectric element or a piezoelectric optical modulator by reducing the hysteresis of the piezoelectric element.

The present invention also provides a method for driving a piezoelectric element, a method for an optical modulator including a piezoelectric element and a recorded medium recorded with a program for executing the same that can prevent image distortion to display more accurate and high definition image by reducing the hysteresis of the piezoelectric element in a color display apparatus using a piezoelectric optical modulator.

An aspect of the present invention features a method for driving a piezoelectric element which causes a displacement object to be displaced by being contracted or expanded according to a supplied driving signal, including supplying a driving signal to the piezoelectric element during a first driving period in a first voltage range; supplying a control signal for controlling a polarization hysteresis of the piezoelectric element according to a driving, performed during the first driving period, to the piezoelectric element; and supplying the driving signal to the piezoelectric element during a second driving period in a second voltage range.

Here, the control signal can maintain a predetermined base voltage value for a first time, a highest voltage value of the second voltage range for a second time and a lowest voltage value of the second voltage range for a third time The polarization hysteresis of the piezoelectric element can be controlled by the control signal to allow the polarization hysteresis to be changed in a closed loop curve having two opposite end points, which are the lowest voltage value and the highest voltage of the second voltage range, during the second driving period.

Another aspect of the present invention features a method for driving an optical modulator including a piezoelectric element which causes a displacement object to be displaced by being contracted or expanded according to a supplied driving signal, including supplying a control signal for controlling a polarization hysteresis of the piezoelectric element caused by a previous subframe to the piezoelectric element; and supplying a driving signal to the piezoelectric element in a modulation voltage range determined according to a color beam of light corresponding to a current frame to modulate the color beam of light.

Here, the control signal can maintain a predetermined base voltage value for a first time, a highest voltage value of the modulation voltage range for a second time and a lowest voltage value of the modulation voltage range for a third time.

The polarization hysteresis of the piezoelectric element can be controlled by the control signal to allow the polarization hysteresis to be changed in a closed loop curve having two opposite end points, which are the lowest voltage value and the highest voltage of the second voltage range, during the second driving period.

The supplying time of the control signal can be determined to be the same as a 1-pixel-modulation time or shorter.

Here, one color image frame is formed by a plurality of subframes. Here, the supplying the control signal and supplying the driving signal can be repeated whenever the modulation of the color beam of light corresponding to each subframe is performed.

Another aspect of the present invention features a recorded medium tangibly embodying a program of instructions executable by a compute, which can execute a method for driving a piezoelectric element causing a displacement object to be displaced by being contracted or expanded according to a supplied driving voltage, the recorded medium being readable by the computer.

Another aspect of the present invention features a recorded medium tangibly embodying a program of instructions executable by a compute, which can execute a method for driving an optical modulator including a piezoelectric element causing a displacement object to be displaced by being contracted or expanded according to a supplied driving voltage, the recorded medium being readable by the computer

BRIEF DESCRIPTION OF THE DRAWINGS

These and other features, aspects and advantages of the present invention will become better understood with regard to the following description, appended claims and accompanying drawings where:

FIG. 7 is a plan view showing an optical modulator array including the piezoelectric optical modulators of FIG. 2;

DESCRIPTION OF THE EMBODIMENTS

Figure 1:
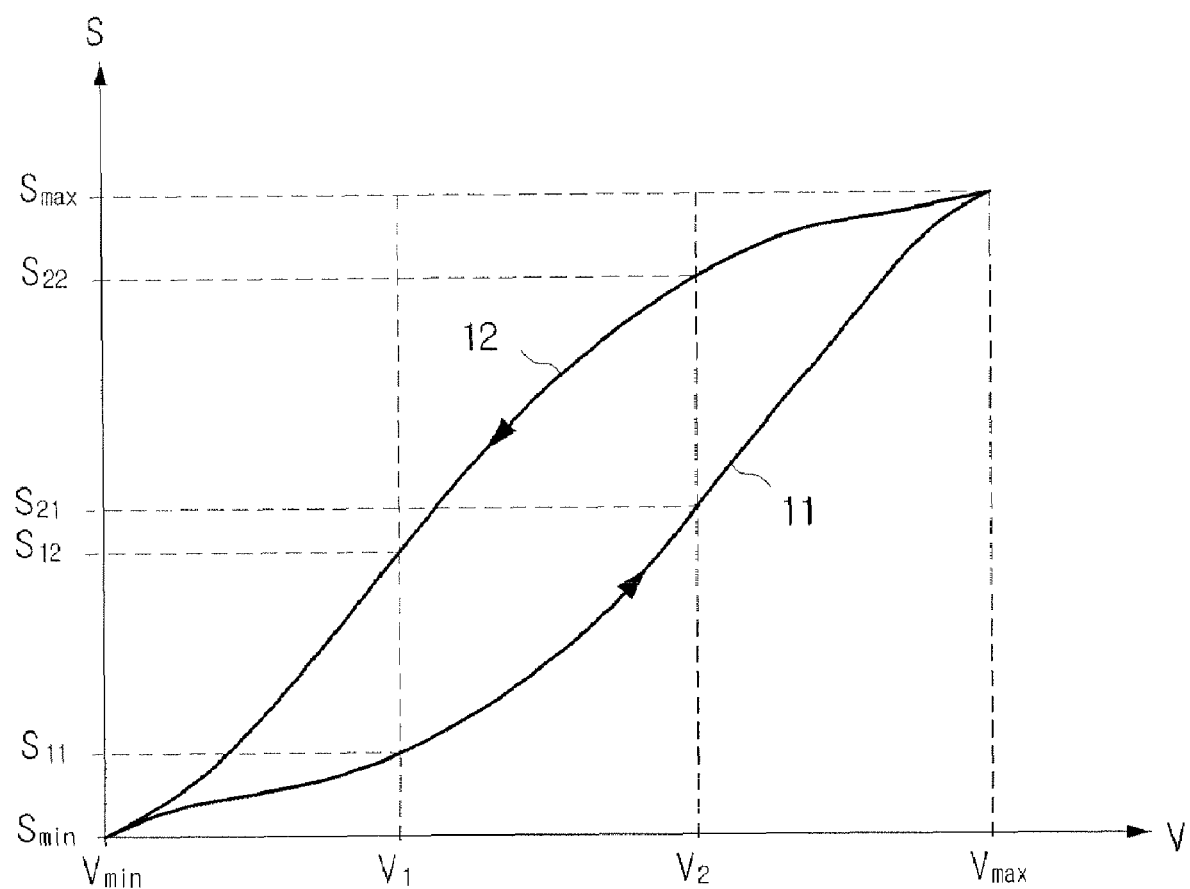
FIG. 1 shows a hysteresis curve of a displacement caused by a displacement object displaced according to a driving voltage supplied to a piezoelectric element.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Prior to describing a method for driving a piezoelectric element and a method for an optical modulator including a piezoelectric element in detail, an optical modulator and a color display apparatus will be described with reference to FIG. 2 through FIG. 9. Also, the below description related to a method for driving a piezoelectric element and a method for an optical modulator including a piezoelectric element with reference to FIG. 10 through FIG. 15 focuses on the case of applying to the optical modulator and the color display apparatus to be described with reference to FIG. 2 through FIG. 9.

Figure 2:
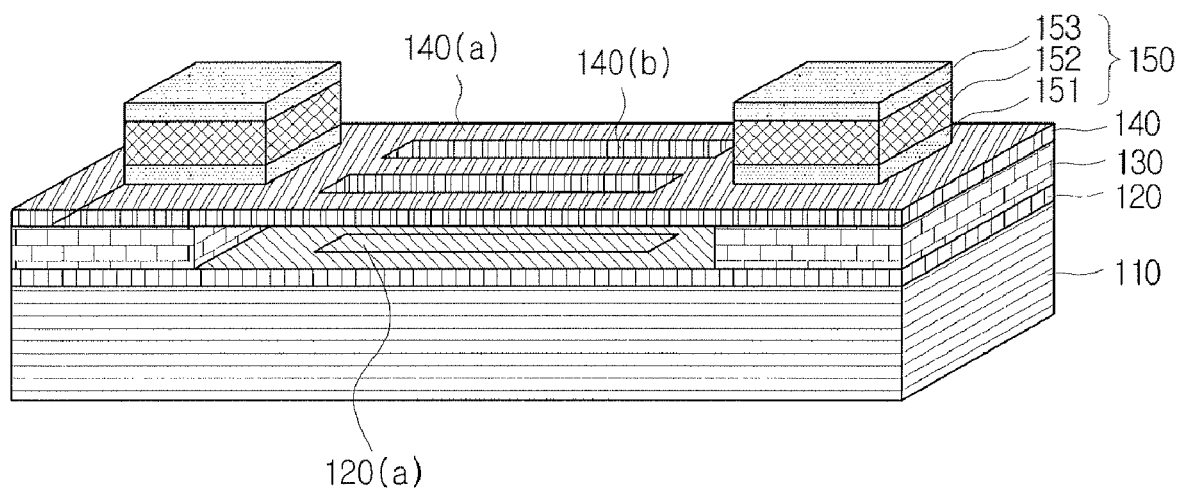
FIG. 2 shows a structure of a piezoelectric optical modulator.
Figure 3:
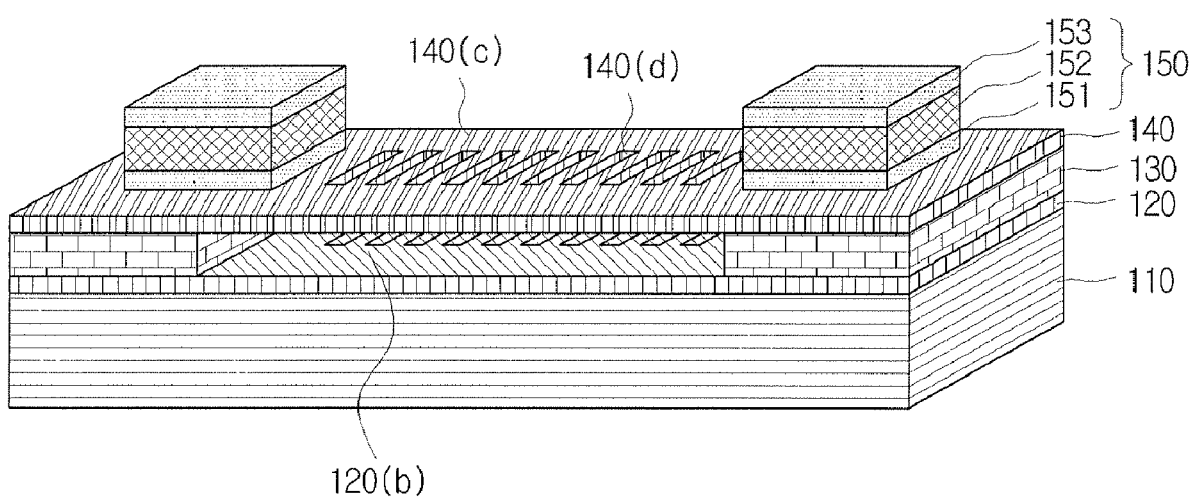
FIG. 3 shows another structure of a piezoelectric optical modulator.
Figure 6A:
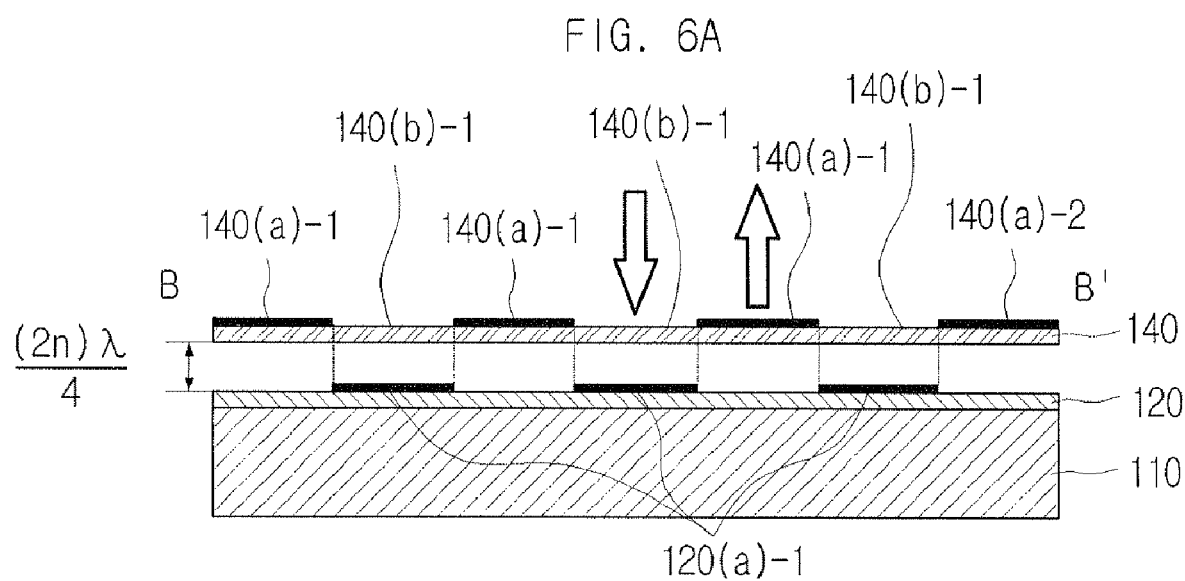
FIG. 6A and FIG. 6B show the principle for allowing an optical modulation to be performed by the piezoelectric optical modulator of FIG. 2.
Figure 6B:
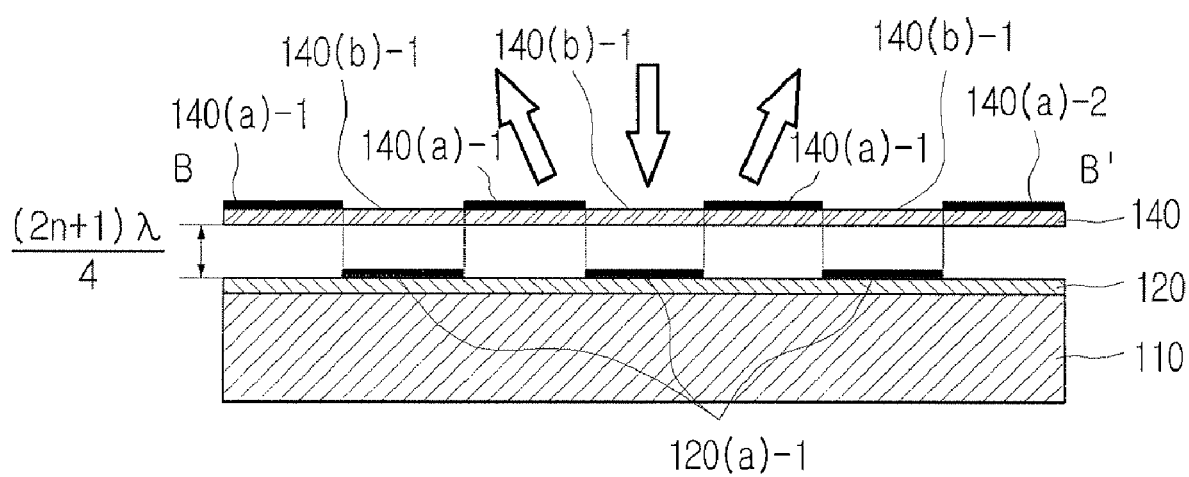

FIG. 2 shows a structure of a piezoelectric optical modulator, and FIG. 3 shows another structure of a piezoelectric optical modulator. FIG. 6A and FIG. 6B show the principle for allowing an optical modulation to be performed by the piezoelectric optical modulator of FIG. 2.

As shown in FIG. 2 and FIG. 3, the piezoelectric optical modulator can include a substrate 110, an insulation layer 120, a sacrificial layer 130, a ribbon structure 140 and a piezoelectric element 150. Here, a plurality of holes 140(b) or 140(d) can be formed in a center part of the ribbon structure 140 (hereinafter, referred to as a ribbon). Also, an upper optical reflection layer 140(a) or 140(c) can be formed in a part of the ribbon in which the holes are formed, and a lower optical reflection layer 120(a) or 120(b) can be formed in a part of the insulation layer 120 to be correspond to the position of the holes. The piezoelectric element 150 can provide a driving force allowing the ribbon to move up and down according to the level of the contraction or expansion of a piezoelectric layer 152 generated by a driving voltage supplied between two electrodes (i.e. a lower electrode 151 and an upper electrode 152).

Figure 4:
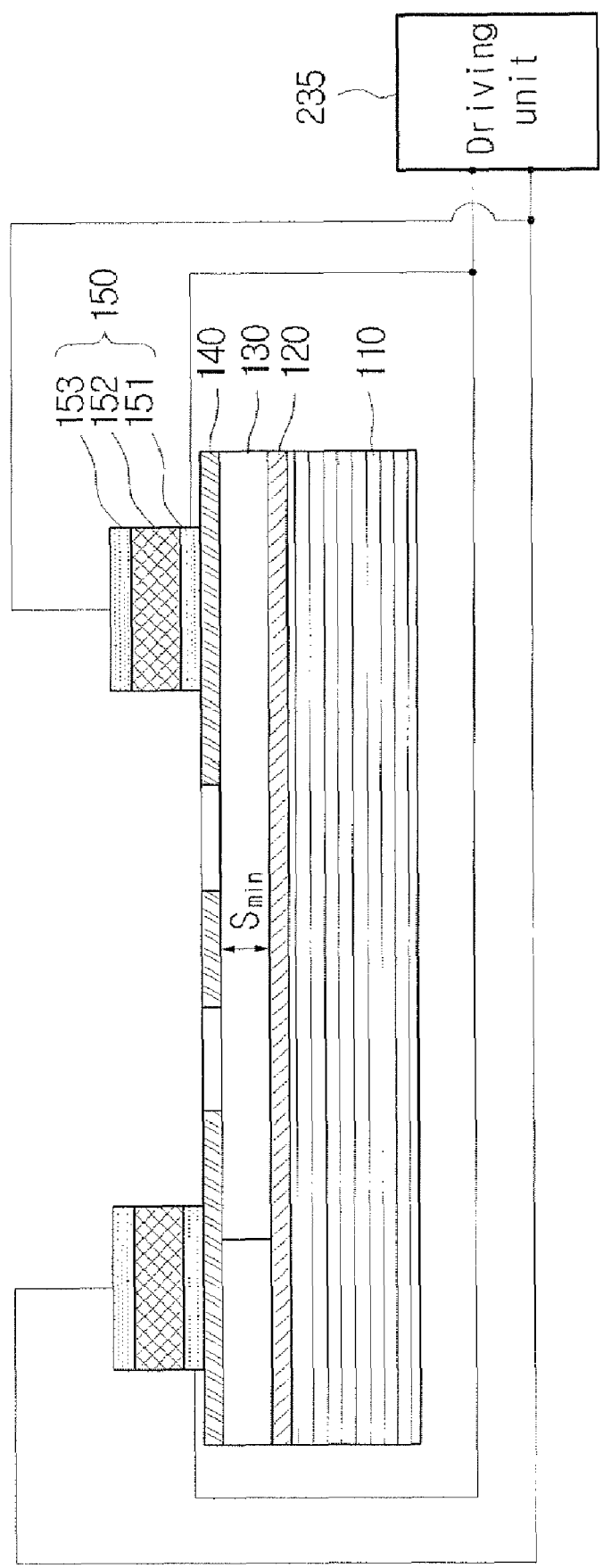
FIG. 4 shows the position of a ribbon in case that no driving voltage is supplied to a piezoelectric optical modulator.
Figure 5:
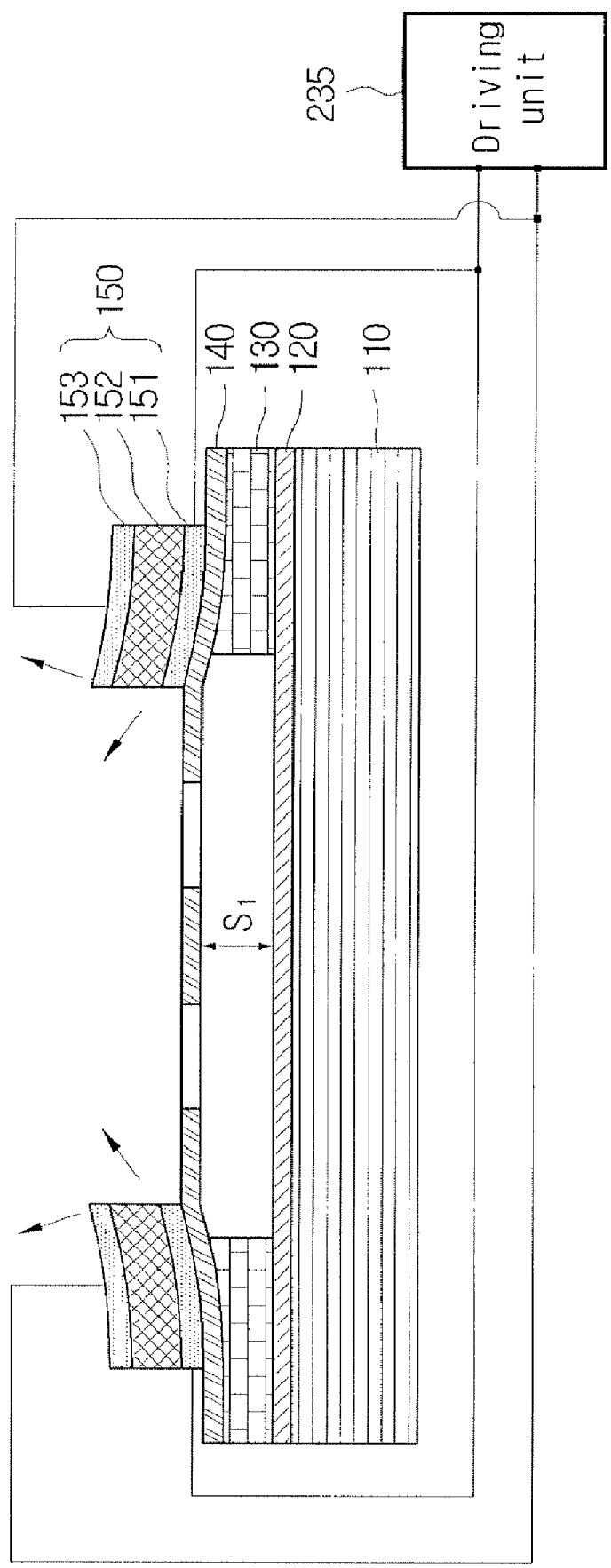
FIG. 5 shows the position of a ribbon in case that a driving voltage is supplied to a piezoelectric optical modulator.

For example, in case that no driving voltage is supplied to the piezoelectric element 150, the ribbon is placed at an original point (i.e. the point that is away from the insulation layer 120 at the distance $S_{min}$) as shown in FIG. 4. Then, if a driving voltage is supplied to the piezoelectric element, the ribbon moves to a point corresponding to the supplied driving voltage (i.e. the point that is away from the insulation layer 120 at the distance $S_1$) as shown in FIG. 5.

Hereinafter, the optical modulating principle of a piezoelectric optical modulator having a piezoelectric element will be described with reference to FIG. 6A and FIG. 6B. Here, FIG. 6A and FIG. 6B are a sectional view showing an optical modulator array which is cut by a line BB' of the below-described FIG. 7.

Referring to FIG. 6A, in case that the wavelength of a beam of light incident on the optical modulator is $\lambda$, a first driving voltage can be supplied to the piezoelectric elements 150. At this time, the first driving voltage can allow the gap between the ribbon formed with the upper reflection layer 140(a) and the insulation layer 120 formed with the lower reflection layer 120(a) to be equal to $(2n)\lambda/4$, n being a natural number. In the case of a $0^{th}$-order diffracted beam of light, the overall path length difference between the light reflected by the upper reflection layer 140(a) and the light reflected by the lower reflection layer 120(a) is equal to $n\lambda$, so that constructive interference occurs and the diffracted light renders its maximum luminance. In the case of $+1^{st}$ or $-1^{st}$ order diffracted light, however, the luminance of the light is at its minimum luminance due to destructive interference.

Referring to FIG. 6B, in case that the wavelength of a beam of light incident on the optical modulator is $\lambda$, a first driving voltage can be supplied to the piezoelectric elements 150. At this time, the first driving voltage can allow the gap between the ribbon formed with the upper reflection layer 140(a) and the insulation layer 120 formed with the lower reflection layer 120(a) to be equal to $(2n+1)\lambda/4$, n being a natural number. In the case of a $0^{th}$-order diffracted beam of light, the overall path length difference between the light reflected by the upper reflection layer 140(a) and the light reflected by the lower reflection layer 120(a) is equal to $(2n+1)\lambda/2$, so that destructive interference occurs and the diffracted light renders its minimum luminance. In the case of $+1^{st}$ or $-1^{st}$ order diffracted light, however, the luminance of the light is at its maximum luminance due to constructive interference.

As such, the piezoelectric optical modulator can load a signal for one pixel on the beam of light by adjusting the quantity of the reflected or diffracted light by use of the result of interference of the reflected light by the upper optical reflection layer 140(a) and the lower optical reflection layer 120(a), respectively, according to the driving voltage supplied to the piezoelectric element. The above description with reference to FIG. 6A and FIG. 6B, which is related to supplying two driving voltages allowing the gap between the ribbon and the insulation layer 120 to be $(2n)\lambda/4$ or $(2n+1)\lambda/4$, can be merely an example.

For example, if the light intensity is assumed to have 0 through 255 values to perform the optical modulation per pixel in the piezoelectric optical modulator described with reference to FIG. 4 through FIG. 7, it is possible to use the driving voltage having a total of 256 gray-scale voltage values. Although the description focuses on the voltage control method supplying a voltage for driving the piezoelectric element and the piezoelectric optical modulator, it is naturally possible to use other driving methods such as the method using a driving signal in order to drive the piezoelectric element and the piezoelectric optical modulator.

Also, although the description related to FIG. 4 through FIG. 6B is concentrated on an optical modulator having a ribbon in which a plurality of holes are formed, it shall be obvious that the present invention can be applied to any piezoelectric optical modulator including a piezoelectric element, which provides a driving force allowing the ribbon as the displacement object to move up and down by being contracted or expanded according to a driving voltage supplied between each electrode to realize the optical diffraction, without restriction.

Figure 8:
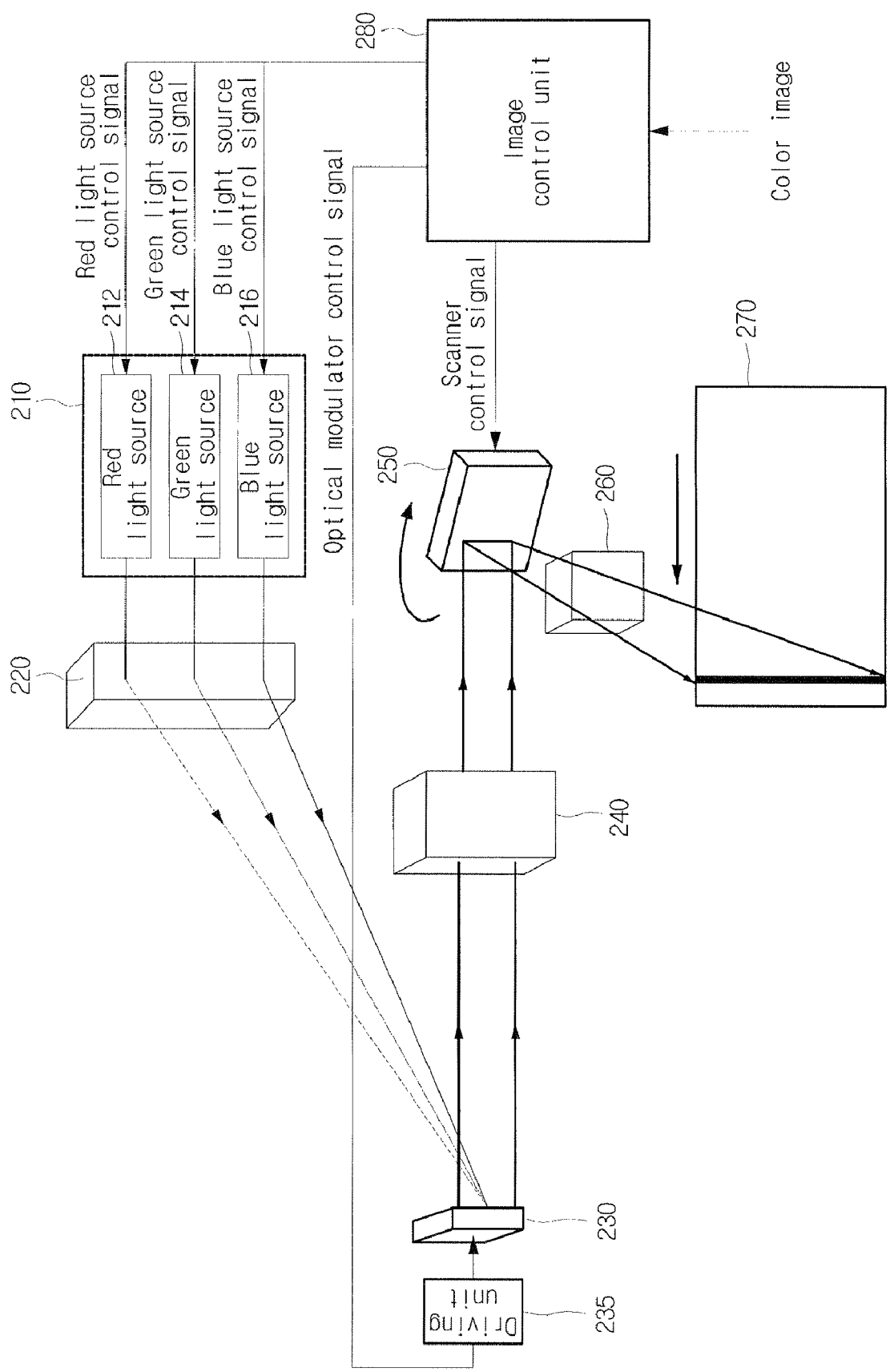
FIG. 8 shows an example of the structure of a color display apparatus using the optical modulator array of FIG. 7.
Figure 9:
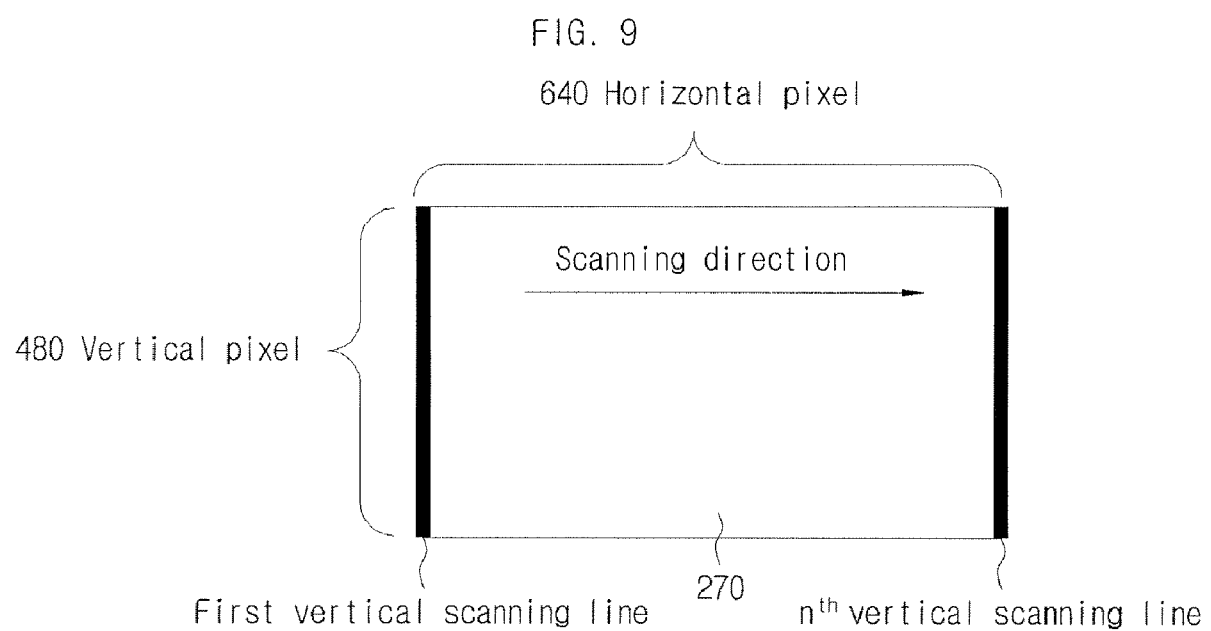
FIG. 9 shows a method for forming an image of 1 frame projected on a screen according to the color display apparatus of FIG. 8.

FIG. 7 is a plan view showing an optical modulator array including the piezoelectric optical modulators of FIG. 2, and FIG. 8 shows an example of the structure of a color display apparatus using the optical modulator array of FIG. 7. FIG. 9 shows a method for forming an image of 1 frame projected on a screen according to the color display apparatus of FIG. 8.

Hereinafter, an example of a color display apparatus using the piezoelectric optical modulator array of FIG. 8 will be described with reference to FIG. 7 and FIG. 9.

The color display apparatus of FIG. 8 can include a three-color light source 210, a lighting optical system 220, an optical modulator array 230, a driving unit 235, a relay optical system 240, a scanner 250, a projection optical system 260, a screen 270 and an image control circuit 280. Here, since the three-color light source 210, the lighting optical system 220, the relay optical system 240 and the projection optical system 260 pertain to typical elements of the display apparatus such as a projection apparatus, the pertinent detailed description will be omitted.

The three-color light source 210 can emit each color beam of light corresponding to predetermined control signals 212, 214 and 216. The emitted color beams of light can be incident on the optical modulator array 230 through the lighting optical system 220.

The optical modulator array 230 can have the same structure as shown in FIG. 7. In particular, the optical modulator array 230, as shown in FIG. 7, can be configured to include m micro-mirrors 100-1, 100-2, . . . , and 100-m, each of which corresponds to a first pixel (pixel #1), a second pixel (pixel #2), . . . and an $m^{th}$ pixel (pixel #m), respectively, to thereby perform the optical modulation for forming a one-dimensional image corresponding to a vertical or horizontal scanning line. For example, if it is assumed that an image displayed on a screen has the resolution of 640(horizontal pixel number)×480(vertical pixel number) and the optical modulator array 230 performs the optical modulation for forming a one-dimensional image corresponding to a vertical scanning line, the optical modulator array 230 can be formed to include a total of 480 optical modulators corresponding to the vertical pixel number.

At this time, each optical modulator of the optical modulator array 230 can generate a diffraction beam of light by performing the optical modulation of the incident color beam of light according to light intensity information of each pixel. Here, the light intensity information can be transferred from the image control circuit 280 (refer to an optical modulator control signal), and the driving unit 235 can allow the optical modulator array 230 to perform the optical modulation for forming a one-dimensional image by supplying a driving voltage having a predetermined magnitude to each optical modulator (i.e. a piezoelectric element included in each modulator).

The scanner 250 can scan a modulation (or diffraction) beam of light transferred from the optical modulator array 230 on the screen 270 according to a scanner control signal transferred from the image control circuit 280. For example, the scanner 250, as shown in FIG. 9, can scan the one-dimensional image corresponding to each vertical scanning line (i.e. a first vertical scanning line through a $n^{th}$ vertical scanning line) transferred from the optical modulator array 230.

A color image of 1 can be displayed on the screen 280 by performing the foregoing optical modulation and scanning of a red beam, a green beam and a blue beam of light one time each, respectively. Here, a total of time that it takes to perform the optical modulation of the red, green and blue beam of light is required to be within 1/(a field frequency according to a television transmission method). Even though the specification focuses on the case of forming a color image by using 3 primary color beams of light, which are a red beam, a green beam and a blue beam of light, it shall be obvious that the color image can be formed by using a combination of other color beams of light.

The field frequency according to the television broadcasting system can refer to a minimum frequency which makes it impossible for a human to visually recognize the discontinuity of video. The television broadcasting system for a color display apparatus can include a national television system committee (NTSC) type and a phase alternation by line (PAL) type.

The NTSC type can matrix-convert red, green and blue signals into one luminance signal Y and two chrominance signals I and Q and multiplex the signals before transmitting signals with 6 MHz frequency bandwidth. The PAL type can complement the color transmission method of the NTSC type. The NTSC type can use 525 scanning lines and the field frequency of 60 Hz, and the PAL type can use 625 scanning lines and the field frequency of 50 Hz.

Accordingly, if each modulation beam of light corresponding to the 3 primary color beams of light, which are the red beam, the green beam and the blue beam of light, is projected on a screen one time each, respectively, within a 1/the field frequency (e.g. 60 Hz in the case of the NTSC type or 50 Hz in the case of PAL type) time, a human eye may recognize as if a full color image having red, green and blue simultaneously is formed on a screen. In other words, a color image of 1 frame can be displayed by allowing a total of subframes of red, green and blue to be displayed on a screen.

Hereinafter, the method for driving an optical modulator including a piezoelectric element will be described in detail with reference to FIG. 10 through FIG. 15.

Figure 10:
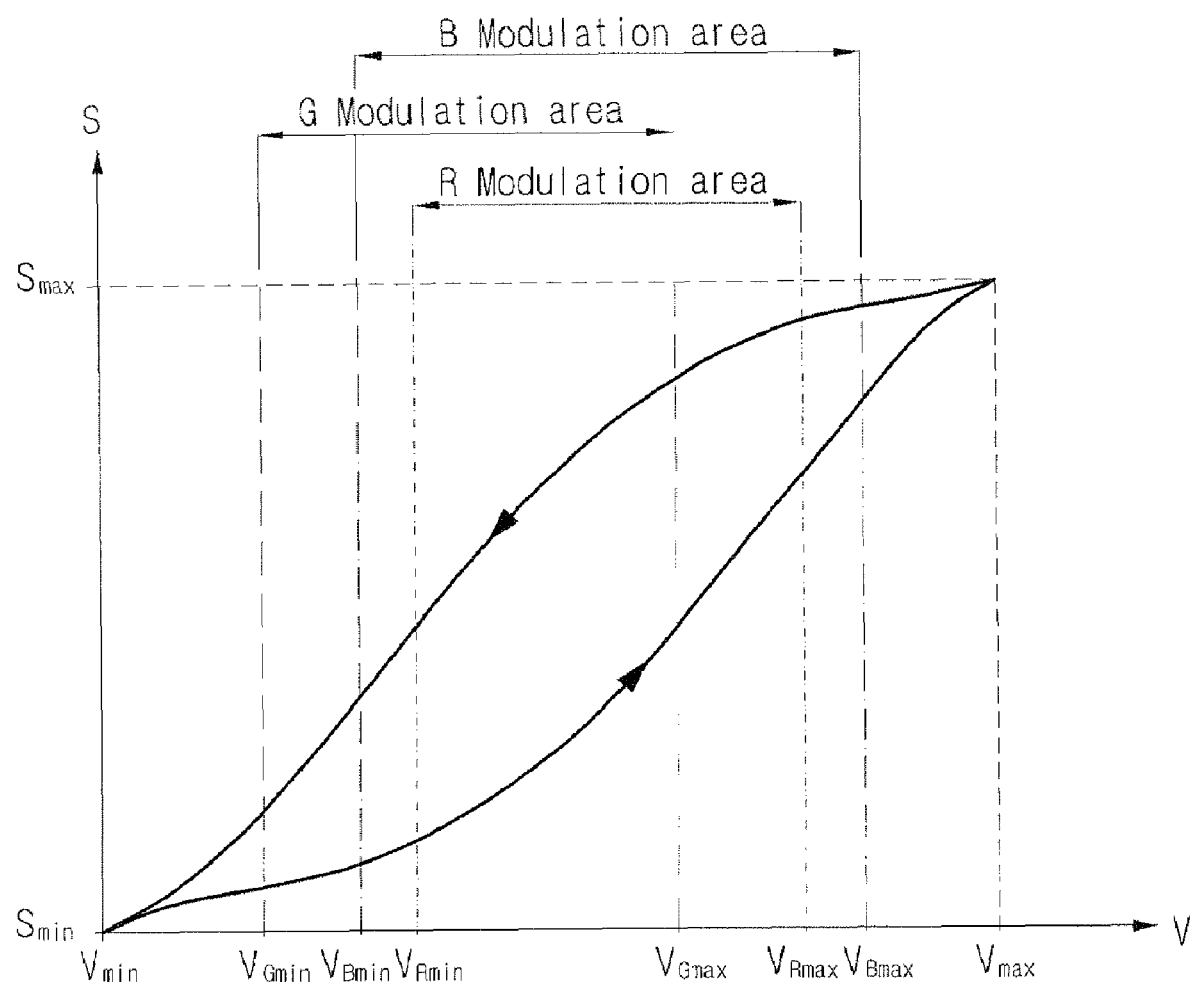
FIG. 10 shows the range of a driving voltage used for an optical modulation performed per color beam of light by a piezoelectric optical modulator.
Figure 11:
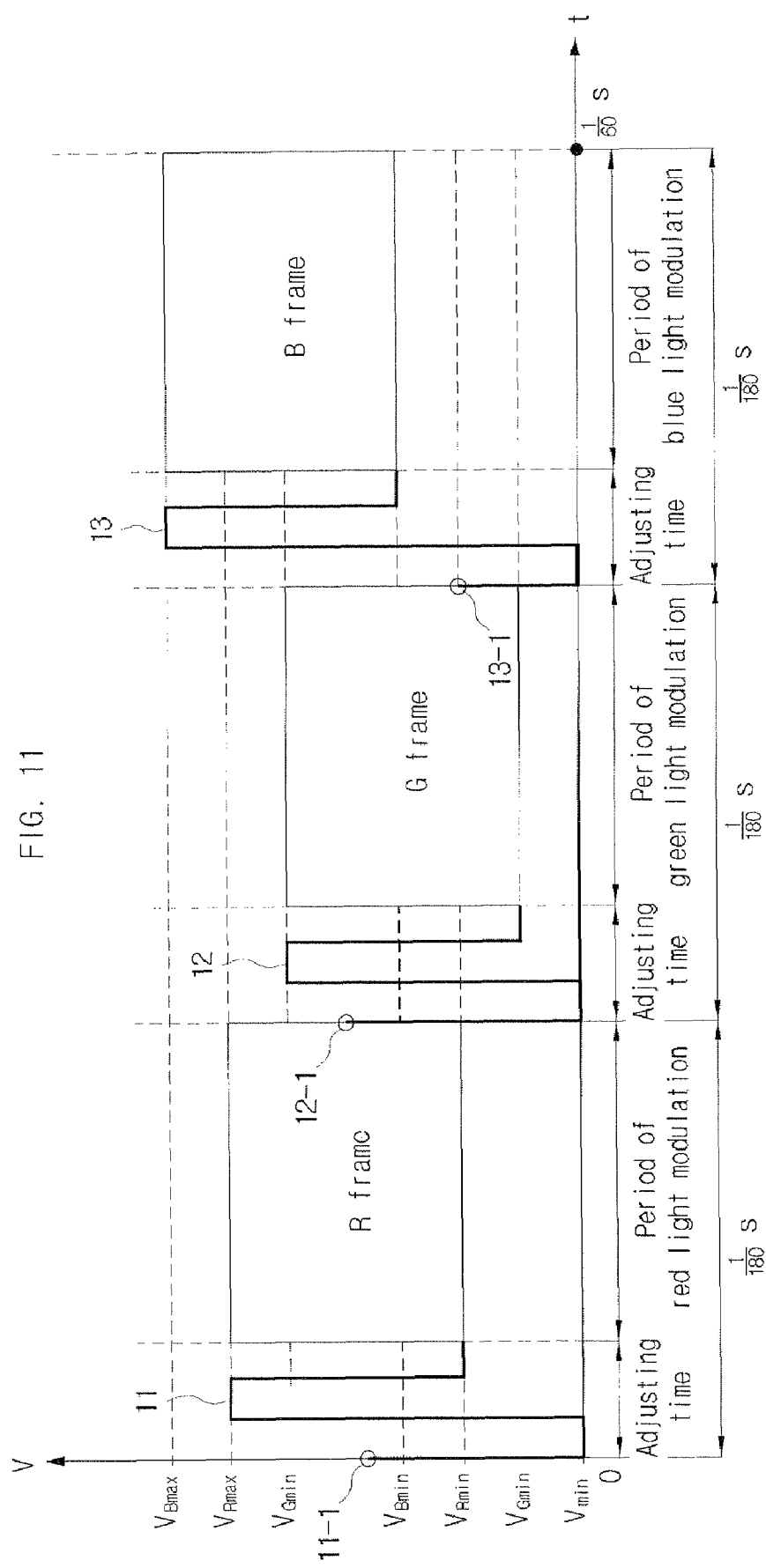
FIG. 11 and FIG. 12 show an optical modulator driving method when an optical modulation is performed per color beam of light by using a piezoelectric optical modulator in accordance with an embodiment of the present invention.
Figure 12:
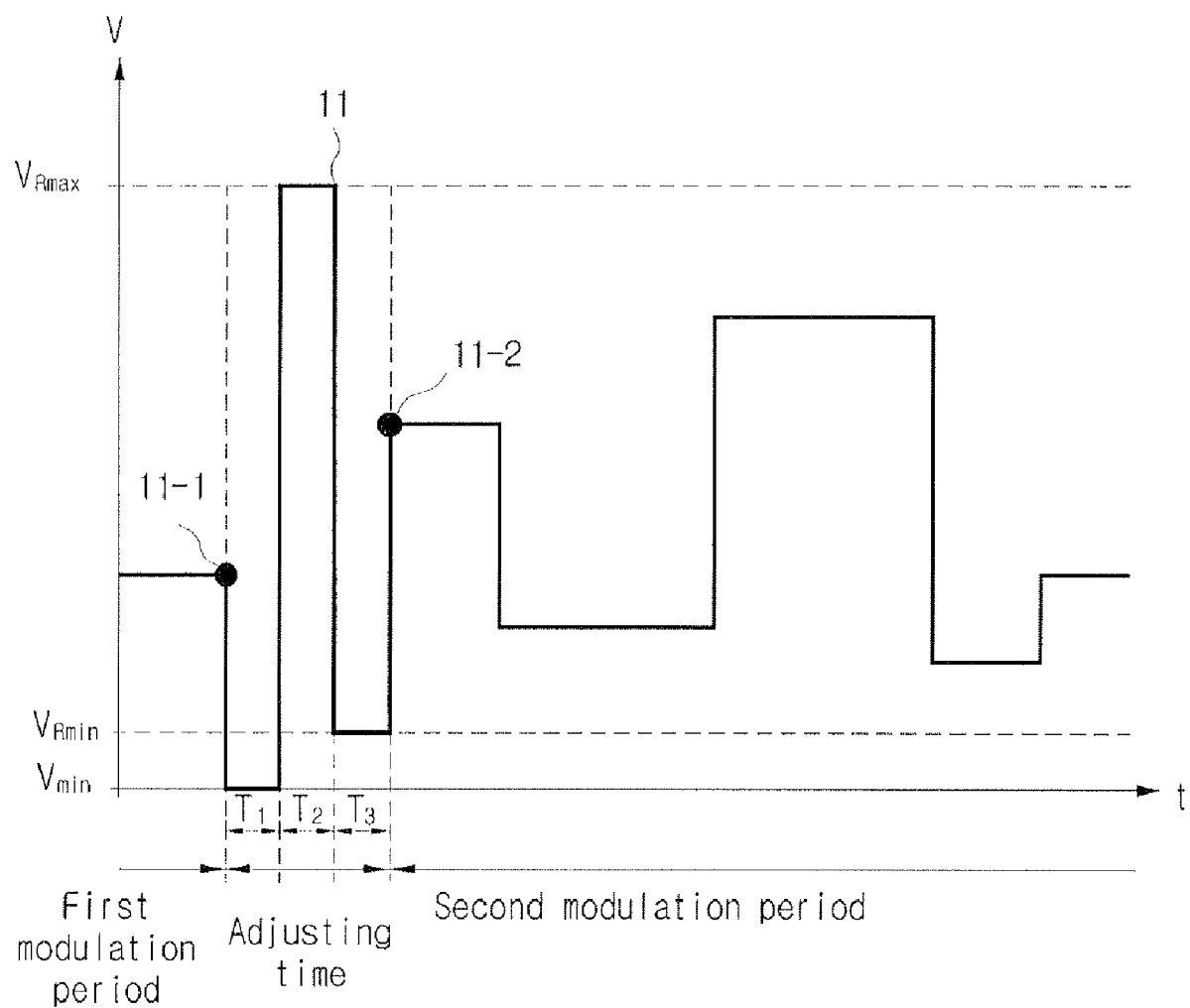

FIG. 10 shows the range of a driving voltage used for an optical modulation performed per color beam of light by a piezoelectric optical modulator, and FIG. 11 and FIG. 12 show an optical modulator driving method when an optical modulation is performed per color beam of light by using a piezoelectric optical modulator in accordance with an embodiment of the present invention.

The range of the driving voltage used for the optical modulation performed per pixel may be the same as shown in FIG. 10. Below is described the case that one pixel is assumed to be represented as an 8 bit image data (i.e. image data distinguished into 256 (0 through 255) graded light intensity magnitudes). In the case of a red beam of light, a driving voltage, which is distinguished into a total of 256 grades within a voltage range having a lowest voltage value $V_{Rmin}$ (i.e. 0 of the light intensity of the red beam) through a highest voltage value $V_{Rmax}$ (i.e. 255 of the light intensity of the red beam), is supplied. In the case of a green beam of light, a driving voltage, which is distinguished into a total of 256 grades within a voltage range having a lowest voltage value $V_{Gmin}$ (i.e. 0 of the light intensity of the green beam) through a highest voltage value $V_{Gmax}$ (i.e. 255 of the light intensity of the green beam), is supplied. In the case of a blue beam of light, a driving voltage, which is distinguished into a total of 256 grades within a voltage range having a lowest voltage value $V_{Bmin}$ (i.e. 0 of the light intensity of the blue beam) through a highest voltage value $V_{Bmax}$ (i.e. 255 of the light intensity of the blue beam), is supplied.

Although the range of the driving voltage distinguished per color beam of light, shown in FIG. 10, is merely an example, it is naturally possible that various modifications are performed according to the design specification such as output magnitude of a light source emitting color beams of light and brightness and definition of a color image to be formed.

FIG. 11 and FIG. 12 show the method for driving a piezoelectric optical modulator including a piezoelectric element in accordance with the present invention. According to the optical modulator driving method with reference to FIG. 11, a first control signal 11 can be supplied to the piezoelectric element 150 for a predetermined adjusting time prior to performing the optical modulation of the red beam of light by using the optical modulator. After that, a driving signal can be supplied to the piezoelectric element 150 within a predetermined driving voltage range (hereinafter, referred to as a first voltage range) in order to perform the optical modulation of the red light. At this time, performing the optical modulation of the red beam can be continued until one subframe of red is completely formed on a corresponding screen (refer to a period of red light modulation of FIG. 11).

Here, the first control signal 11 can be determined as a pulse signal, which maintains a predetermined base voltage value (refer to $V_{min}$ of FIG. 10 and FIG. 11) for a first time (refer to $T_1$ of FIG. 12), the highest voltage value (refer to $V_{Rmax}$ of FIG. 11 and FIG. 12) of the first voltage range for a second time (refer to $T_2$ of FIG. 12) and the lowest voltage value (refer to $V_{Rmin}$ of FIG. 11 and FIG. 12) of the first voltage range for a third time (refer to $T_3$ of FIG. 12).

Here, the first control signal 11, supplied prior to performing the optical modulation of the color light, can control the polarization hysteresis generated in the driving piezoelectric element. The same can apply to a second control signal 12 and a third control signal 13, to be described later. The corresponding detailed description and the polarization hysteresis controlling principle can be clearly understood with reference to FIG. 13 and FIG. 14.

After performing the optical modulation of the red light is completed, the second control signal 12 can be supplied to the piezoelectric element 150 for a predetermined adjusting time. After the second control signal 12 is supplied, a driving signal can be supplied to the piezoelectric element 150 within a predetermined driving voltage range (hereinafter, referred to as a second voltage range) in order to perform the optical modulation of the green light. At this time, performing the optical modulation of the green beam can be continued until one subframe of green is completely formed on a corresponding screen (refer to a period of green light modulation of FIG. 11).

Here, the second control signal 12 can be determined as a pulse signal, which maintains a predetermined base voltage value (refer to $V_{min}$ FIG. 11) for a first time (i.e. the same time as $T_1$ of FIG. 12), the highest voltage value (refer to $V_{Gmax}$ of FIG. 11) of the second voltage range for a second time (i.e. the same time as $T_2$ of FIG. 12) and the lowest voltage value (refer to $V_{Gmin}$ of FIG. 11) of the second voltage range for a third time (i.e. the same time as $T_3$ of FIG. 12).

After performing the optical modulation of the green light is completed, the third control signal 13 can be supplied to the piezoelectric element 150 for a predetermined adjusting time. After the third control signal 13 is supplied, a driving signal can be supplied to the piezoelectric element 150 within a third voltage range in order to perform the optical modulation of the blue light.

The first control signal 13 can be determined as a pulse signal, which maintains a predetermined base voltage value (refer to $V_{min}$ FIG. 11) for a first time (i.e. the same time as $T_1$ of FIG. 12), the highest voltage value (refer to $V_{Bmax}$ of FIG. 11) of the third voltage range for a second time (i.e. the same time as $T_2$ of FIG. 12) and the lowest voltage value (refer to $V_{Bmin}$ of FIG. 11) of the third voltage range for a third time (i.e. the same time as $T_3$ of FIG. 12).

Here, performing the optical modulation of the blue beam can be also continued until one subframe of blue is completely formed on a corresponding screen (refer to a period of blue light modulation of FIG. 11). As a result, a whole color image of one frame can be formed by allowing a total of 3 subframes of red, green and blue to be successively displayed on a screen within a 1/(the field frequency according to the television broadcasting system, and for example, 60 Hz in an embodiment of the present invention)time (refer to FIG. 15, to be described later).

Figure 13:
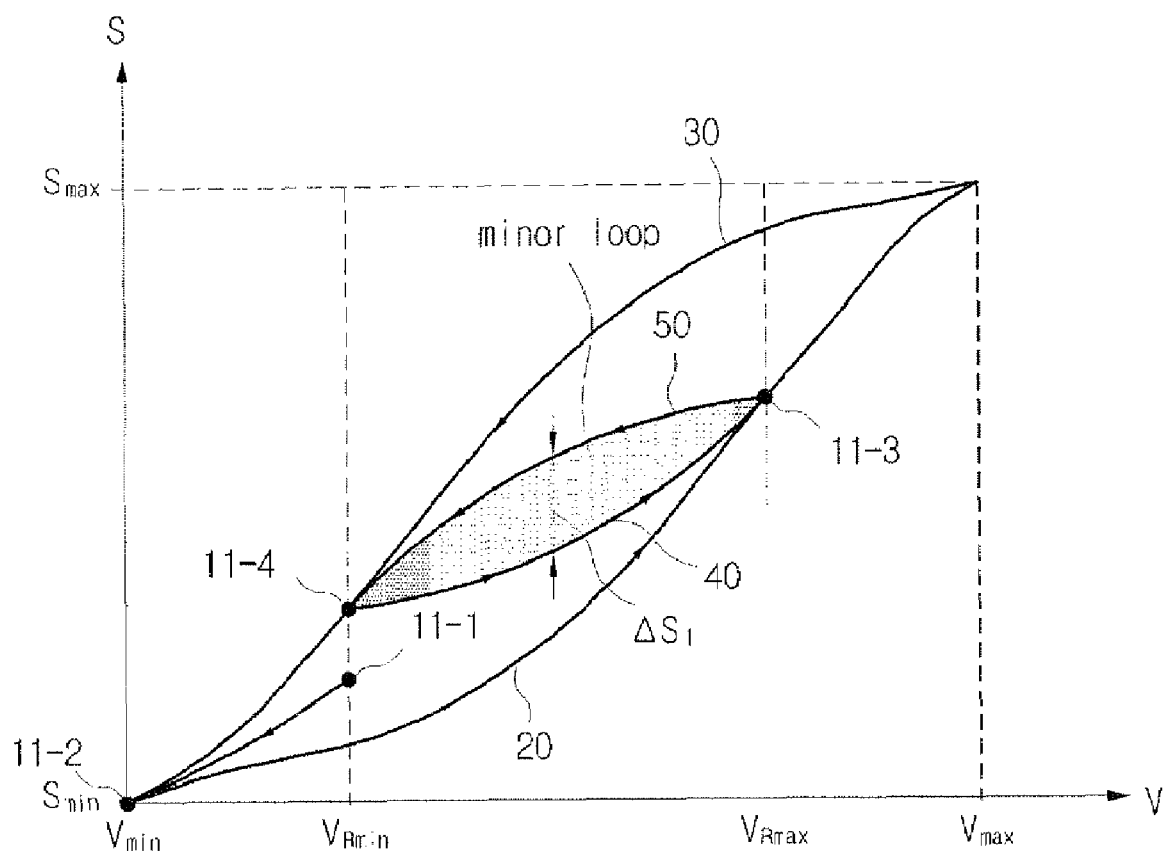
FIG. 13 and FIG. 14 show the principle of controlling the polarization hysteresis of a piezoelectric element when an optical modulator driving method in accordance with an embodiment of the present invention.
Figure 14:
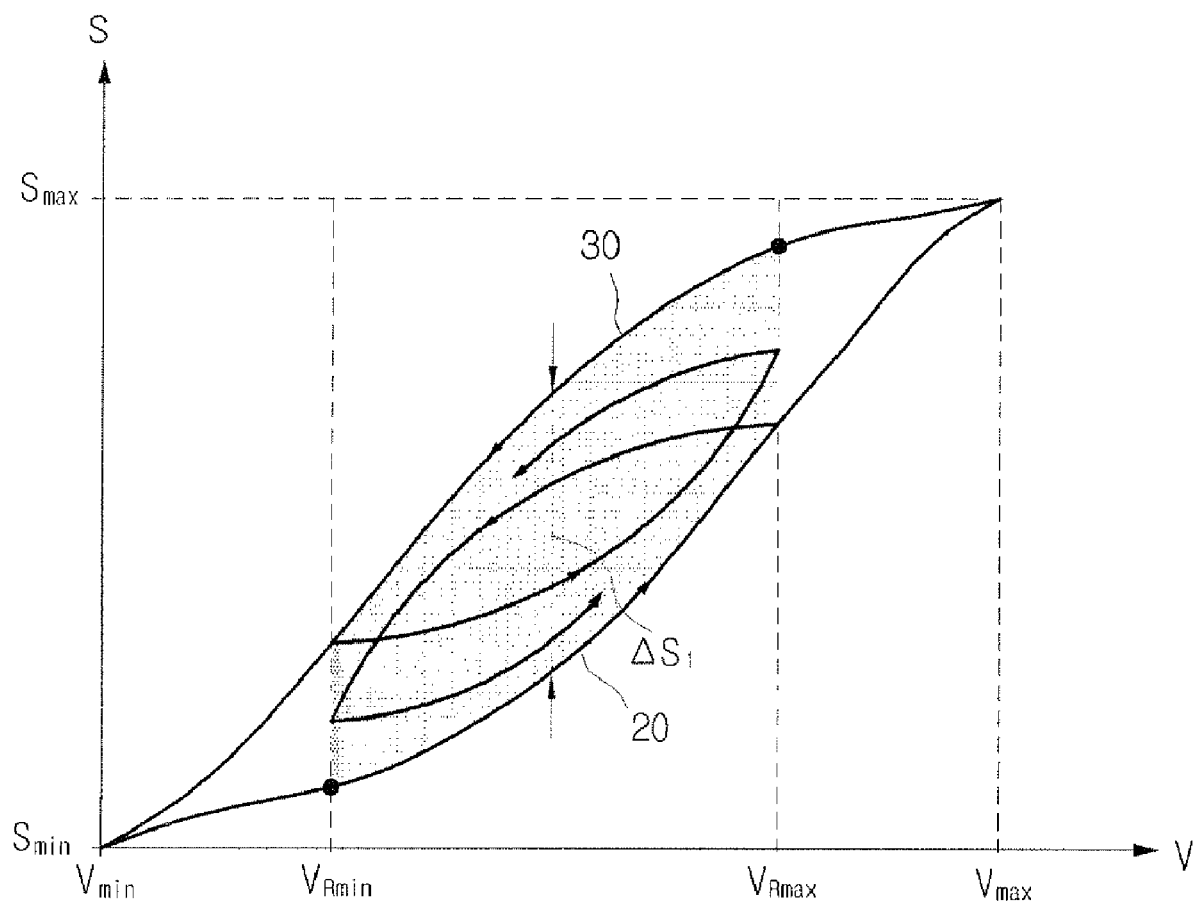

FIG. 13 and FIG. 14 show the principle of controlling the polarization hysteresis of a piezoelectric element when an optical modulator driving method in accordance with an embodiment of the present invention. Here, FIG. 13 shows the polarization hysteresis of a piezoelectric element when the piezoelectric element or an optical modulator is driven in accordance with the driving method of the present invention, and FIG. 14 shows the polarization hysteresis of a piezoelectric element driven by the conventional driving method.

In the case of driving a piezoelectric element or an optical modulator by the driving method of the present invention, shown in FIG. 11 or FIG. 12, the polarization hysteresis shown by the piezoelectric element 150 can be changed according to a minor loop as shown in FIG. 13.

In particular, if the predetermined control signals are supplied between the intervals of time when the optical modulation is performed per color light according to the driving method of the present invention, the polarization hysteresis may be changed according to polarization hysteresis curves 40 and 50, which are the minor loop formed inside of FIG. 13, instead of polarization hysteresis curves 20 and 30, which are the original main loop of FIG. 13. The corresponding detailed reason will be described below by focusing on the case of the first control signal 11 of FIG. 11 and FIG. 12.

Firstly, since the voltage corresponding to the predetermined base voltage value 11-2 of FIG. 13 is maintained for the first time of the first control signal 11 prior to performing the optical modulation of the red light, the polarization hysteresis can be restored to the original state. In other words, the polarization hysteresis generated by the driving voltage value 11-1 of FIG. 11 through FIG. 13, finally supplied when the optical modulation of one subframe of previous color light is completed, can be removed for first time to return to the original state.

At this time, in the case of using a driving voltage of 0V through 10V for the optical modulation, the base voltage value can be determined as 0V, for example. It shall be obvious that the base voltage value can be determined as another voltage according to the design specification. Since the voltage corresponding to the highest voltage value (refer to $V_{Rmax}$ of FIG. 11 and FIG. 12 and the reference number 11-3 of FIG. 13) of the first voltage range is maintained for the second time of the first control signal 11, the polarization hysteresis can be changed according to the curve 20 of the main loop. Similarly, since the voltage corresponding to the lowest voltage value (refer to $V_{Rmin}$ of FIG. 11 and FIG. 12 and the reference number 11-4 of FIG. 13) of the first voltage range is maintained for the second time of the first control signal 11, the polarization hysteresis can be changed according to the curve 50 of the minor loop Accordingly, if the optical modulation of the red light is performed after the first control signal 11 is supplied to the piezoelectric element 150, the polarization hysteresis can be controlled so as to be changed in the closed loop of minor loop having two opposite end points, which are the lowest voltage value 11-4 and the highest voltage 11-3 of the first voltage range.

In the case of the second control signal 12 or the third control signal 13, the same result can be deduced. This shows that the driving method of the present invention can largely reduce a driving error generated according to the original polarization hysteresis (i.e. the main loop 20 and 30 of FIGS. 13 and 14) of the piezoelectric element 150 by using the method by which a predetermined control signal is supplied to the piezoelectric element 150 before the optical modulation of each pertinent color light is performed (refer to □$S_1$ of FIG. 13 and □$S_1$ of FIG. 14).

As such, since reducing a driving error generated according to the original polarization hysteresis of a piezoelectric element helps to enhance the accuracy and reliability of the pertinent operation, it is possible to form a more accurate or definitive color image in a color display apparatus as an example of a piezoelectric element or a piezoelectric optical modulator.

Figure 15:
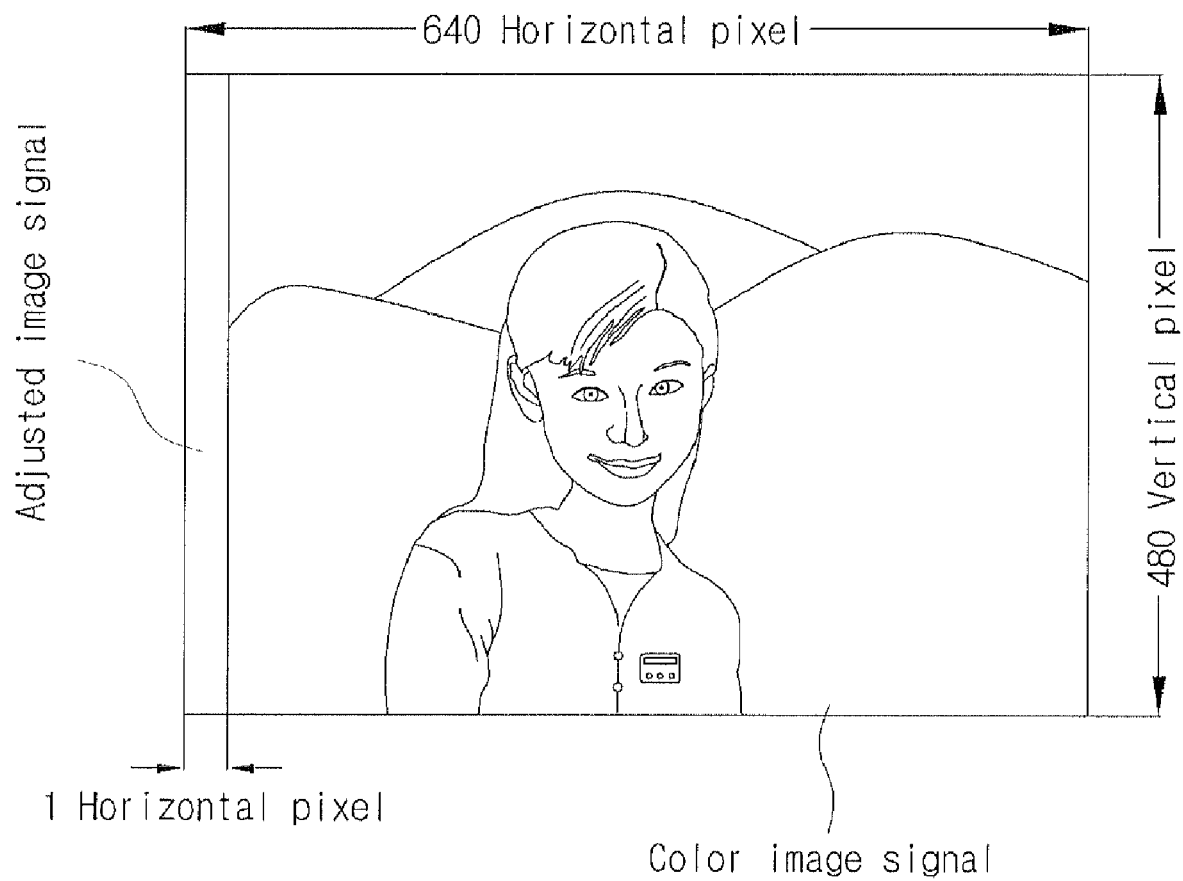
FIG. 15 is an example of a color image formed by an optical modulator driving method of the present invention.

FIG. 15 is an example of a color image formed by an optical modulator driving method of the present invention.

Performing the optical modulation of the color light according to the driving method of the present invention makes it possible to form the same image as shown in FIG. 15 on a screen. In particular, in addition to the color image formed according to the optical modulation of actual color light, an image formed by a control signal (refer to an adjusted image signal of FIG. 15) can be displayed together on the front part of the image of 1 frame. The adjusted image signal which is a useless image data generated regardless of the color image to be actually formed in one image frame may be considered as a kind of loss of display space.

However, if it is possible to control the part of the 1 image frame, which is occupied by the adjusted image signal, to be minimized (e.g. 1 horizontal pixel or smaller as shown in FIG. 15), a user may be unable to recognize the part and may be able to have no effect on the overall color image formed on a screen. On the other hand, if the optical modulation is performed per color light after the control signal is supplied to the piezoelectric element, the polarization hysteresis can be largely reduced, to thereby perform more accurate optical modulation and form a more definitive and high quality color image.

Accordingly, the adjusting time (refer to FIG. 11 and FIG. 12) of the polarization hysteresis according to the control signal supplied prior to performing the actual optical modulation per color light can be determined as a 1-pixel-modulation time or shorter.

Although the above description is mainly related to the method for driving a piezoelectric element or a piezoelectric optical modulator, it shall be easily understood by any person of ordinary skill in the art that the driving method can be recorded in a recorded medium (e.g. hard disk or CD-ROM)

capable of being readable by a computer by tangibly embodying a program of instructions for executing the driving method.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. A method for driving an optical modulator including a piezoelectric element causing a displacement object to be displaced by being contracted or expanded according to a supplied driving voltage, the method comprising:
   supplying a control signal for controlling a polarization hysteresis of the piezoelectric element caused by a previous subframe to the piezoelectric element; and
   supplying a driving signal to the piezoelectric element in a modulation voltage range determined according to a color beam of light corresponding to a current subframe to modulate the color beam of light.

2. The method of claim 1, wherein the control signal maintains a predetermined base voltage value for a first time, a highest voltage value of the modulation voltage range for a second time and a lowest voltage value of the modulation voltage range for a third time.

3. The method of claim 1, wherein the polarization hysteresis of the piezoelectric element is controlled by the control signal to allow the polarization hysteresis to be changed in a closed loop curve having two opposite end points, which are the lowest voltage value and the highest voltage of the modulation voltage range, during the current subframe.

4. The method of claim 1, wherein a supplying time of the control signal is determined to be the same as a 1-pixel-modulation time or shorter.

5. The method of claim 1, wherein one color image frame is formed by a plurality of subframes,
   whereas the supplying the control signal and supplying the driving signal are repeated whenever the modulation of the color beam of light corresponding to each subframe is performed.

* * * * *